United States Patent
Andersen et al.

(10) Patent No.: US 7,078,963 B1
(45) Date of Patent: Jul. 18, 2006

(54) INTEGRATED PULSHI MODE WITH SHUTDOWN

(75) Inventors: Jack B. Andersen, Austin, TX (US); Brian E. Attwood, Temecula, CA (US)

(73) Assignee: D2Audio Corporation, Austin, TX (US)

( * ) Notice: Subject to any disclaimer, the term of this patent is extended or adjusted under 35 U.S.C. 154(b) by 132 days.

(21) Appl. No.: 10/805,592

(22) Filed: Mar. 19, 2004

Related U.S. Application Data

(60) Provisional application No. 60/469,760, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H03F 3/38* (2006.01)

(52) U.S. Cl. ...................................................... 330/10

(58) Field of Classification Search .................. 330/10, 330/251, 207 A, 195
See application file for complete search history.

(56) References Cited

U.S. PATENT DOCUMENTS

| | | | | |
|---|---|---|---|---|
| 5,118,997 A | * | 6/1992 | El-Hamamsy | ............... 315/248 |
| 6,064,259 A | * | 5/2000 | Takita | .......................... 330/10 |
| 6,294,954 B1 | * | 9/2001 | Melanson | ..................... 330/10 |
| 2004/0036533 A1 | * | 2/2004 | Mazda | ......................... 330/251 |

* cited by examiner

*Primary Examiner*—Zandra V. Smith
*Assistant Examiner*—Hieu Nguyen

(57) ABSTRACT

Systems and methods for controlling amplification of a pair of pulse width modulated signals. In one embodiment, a system comprises an audio amplifier which is configured to receive a pulse code modulated (PCM) input signal, convert this signal to a pulse width modulated (PWM) signal in a controller, and amplify the PWM signal in an output stage. The controller separates the PWM signal into a high-side signal and a low-side signal. The controller incorporates digitally programmable delays into the processing paths for each of the high-side and low-side signals. The high-side and low-side signals are separately provided to the output stage. The separate high-side and low-side signals can be used to individually control (e.g., turn off) the high-side and low-side transistors. Circuitry is included to generate a short low-side pulse when both transistors are turned off in order to drain the gate charge from the high-side transistor.

14 Claims, 6 Drawing Sheets

INTEGRATED PULSHI MODE WITH SHUTDOWN

RELATED APPLICATIONS

This application claims priority to: U.S. Provisional Patent Application No. 60/469,760, entitled "Integrated PULSHI Mode with Shutdown," by Andersen, et al., filed May 12, 2003; U.S. Provisional Patent Application No. 60/456,414, entitled "Adaptive Anti-Clipping Protection," by Taylor, et al., filed Mar. 21, 2003; U.S. Provisional Patent Application No. 60/456,430, entitled "Frequency Response Correction," by Taylor, et al., filed Mar. 21, 2003; U.S. Provisional Patent Application No. 60/456,429, entitled "High-Efficiency, High-Performance Sample Rate Converter," by Andersen, et al., filed Mar. 21, 2003; U.S. Provisional Patent Application No. 60/456,421, entitled "Output Device Switch Timing Correction," by Taylor, et al., filed Mar. 21, 2003; U.S. Provisional Patent Application No. 60/456,422, entitled "Output Filter, Phase/Timing Correction," by Taylor, et al., filed Mar. 21, 2003; U.S. Provisional Patent Application No. 60/456,428, entitled "Output Filter Speaker/Load Compensation," by Taylor, et al., filed Mar. 21, 2003; U.S. Provisional Patent Application No. 60/456,420, entitled "Output Stage Channel Timing Calibration," by Taylor, et al., filed Mar. 21, 2003; U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND

1. Field of the Invention

The invention relates generally to signal amplification systems, and more particularly to systems and methods for driving a pair of high-voltage transistors in a pulse width modulated audio amplification system.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in very low performance applications. These applications were very complex and costly to implement. Consequently, these solutions were not widely accepted. Class D technology was therefore unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

There are a number of problems with existing digital PWM modulation schemes. One of the problems is that the audio system has to drive a pair of high-voltage field effect transistors (FETs) at the output of the system. Thus, is typically necessary to provide a high-voltage driver circuit to drive the FETs. Generally speaking, it is more difficult to design a high-voltage driver circuit than a low-voltage driver circuit, and it is more complicated and expensive to manufacture the high-voltage circuit. Another problem with existing schemes is that they do not to provide significant control over the individual FETs in terms of controlling delays in the corresponding signals and enabling shutdown of the FETs.

SUMMARY OF THE INVENTION

One or more of the problems outlined above may be solved by the various embodiments of the invention. Broadly speaking, the invention comprises systems and methods for controlling amplification of a pair of pulse width modulated signals. In one embodiment, a system comprises an audio amplifier which is configured to receive a pulse code modulated (PCM) input signal, convert this signal to a pulse width modulated (PWM) signal in a controller, and amplify the PWM signal in an output stage. The controller separates the PWM signal into a high-side signal and a low-side signal. The controller incorporates digitally programmable delays into the processing paths for each of the high-side and low-side signals. The high-side and low-side signals are separately provided to the output stage. The separate high-side and low-side signals can be used to individually control (e.g., turn off) high-side and low-side transistors (e.g., FETs). Circuitry is included to generate a short low-side pulse when both transistors are turned off in order to drain the gate charge from the high-side transistor.

One embodiment comprises a system having a pulse width modulation (PWM) controller and an output stage that is driven by a pair of signals generated by the PWM controller. The PWM controller provides a first output for a high-side PWM signal and a second output for a low-side PWM signal. The output stage is configured to receive the separate high-side and low-side signals from the PWM controller outputs. The high-side signal consists of a series of turn-on pulses and is coupled to a high-side transistor through a pulse transformer. The low-side signal comprises a series of PWM pulses that are coupled to a low-side transistor through a level shifting capacitor. The low-side signal is also capacitively coupled to a third transistor that turns off the high-side transistor when the low-side transistor is turned on.

In one embodiment, the PWM controller incorporates a digitally programmable delay unit for each of the high-side and low-side signals. By controlling the delays of the respective channels, the relative phases of the signals can be adjusted to achieve a desired amount of dead time or overlap of the signals. In one embodiment, the high-side signal is coupled to the high-side transistor through a pulse transformer in order to allow a low-voltage driver to be used to amplify the signal. In one embodiment, the PWM controller is configured to produce a short pulse of the low-side signal at shutdown in order to drain charge from the gate of the high-side transistor and to thereby turn it off if it is active at shutdown.

Numerous additional embodiments are also possible.

The various embodiments of the invention may provide a number of advantages over the prior art. For example, they may enable the use of a low-voltage, low-cost driver circuit instead of a high-voltage circuit to drive the high-voltage transistors in the output stage. Various embodiments may also enable level shifting between the controller and the output stage. Further, various embodiments may enable both high-side and low-side transistors in the output stage to be turned off at shutdown.

BRIEF DESCRIPTION OF THE DRAWINGS

Other objects and advantages of the invention may become apparent upon reading the following detailed description and upon reference to the accompanying drawings.

Figure 1:
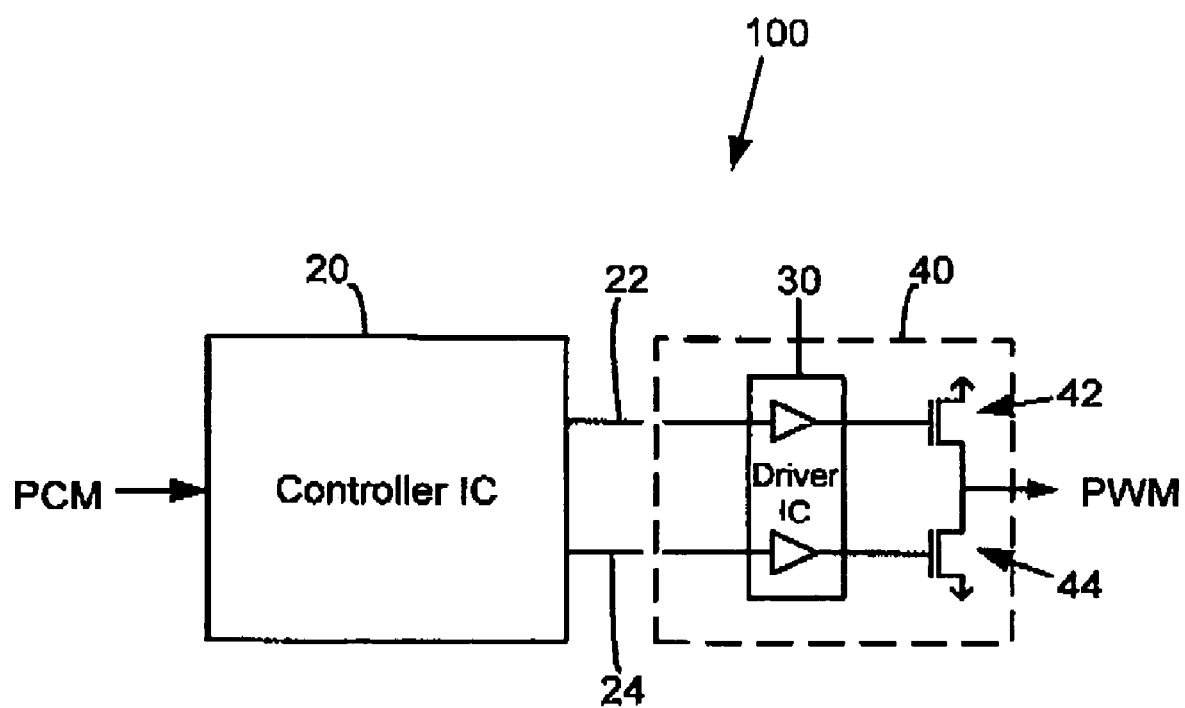
FIG. 1 is a diagram illustrating the components of one channel of an exemplary PWM audio amplifier in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for controlling amplification of a pair of pulse width modulated signals. In one embodiment, a system comprises an audio amplifier which is configured to receive a pulse code modulated (PCM) input signal, convert this signal to a pulse width modulated (PWM) signal in a controller, and amplify the PWM signal in an output stage. The controller separates the PWM signal into a high-side signal and a low-side signal. The controller incorporates digitally programmable delays into the processing paths for each of the high-side and low-side signals. The high-side and low-side signals are separately provided to the output stage. The separate high-side and low-side signals can be used to individually control (e.g., turn off) the high-side and low-side transistors. Circuitry is included to generate a short low-side pulse when both transistors are turned off in order to drain the gate charge from the high-side transistor.

Referring to FIG. 1, a diagram illustrating the components of one channel of an exemplary PWM audio amplifier in accordance with the prior art is shown. The figure is simplified to only show the major components of the system. As depicted in the figure, system 100 comprises a controller circuit 20, a driver circuit 30 and an output stage 40. A pulse code modulated (PCM) audio signal is input to controller circuit 20. Controller circuit 20 shapes and modulates that received audio signal and generates pulse width modulated (PWM) audio.

Controller circuit 20 provides two separate outputs, 22 and 24, which are provided to driver circuit 30. Driver circuit thirty typically performs level shifting and amplifies the drive signals that control the output transistors (which are typically field effect transistors, or FETs). One of the outputs provides a signal to the high side of driver circuit 30 (hence to FET 42), while the other output provides a signal to the low side of driver circuit 30 (hence to FET 44). Driver circuit 30 drives the signals on the respective FETs, resulting in the output of an amplified PWM signal.

It should be noted that, while FIG. 1 and the majority of this disclosure focus on a single channel, implementation of the present systems and methods is not limited to single-channel amplifiers.

As noted above, one of the problems with the configuration of FIG. 1 is the fact that driver circuit 30 has to be a high-voltage circuit in order to drive the high-voltage FETs. These high-voltage driver circuits are costly to design and manufacture.

Figure 2:
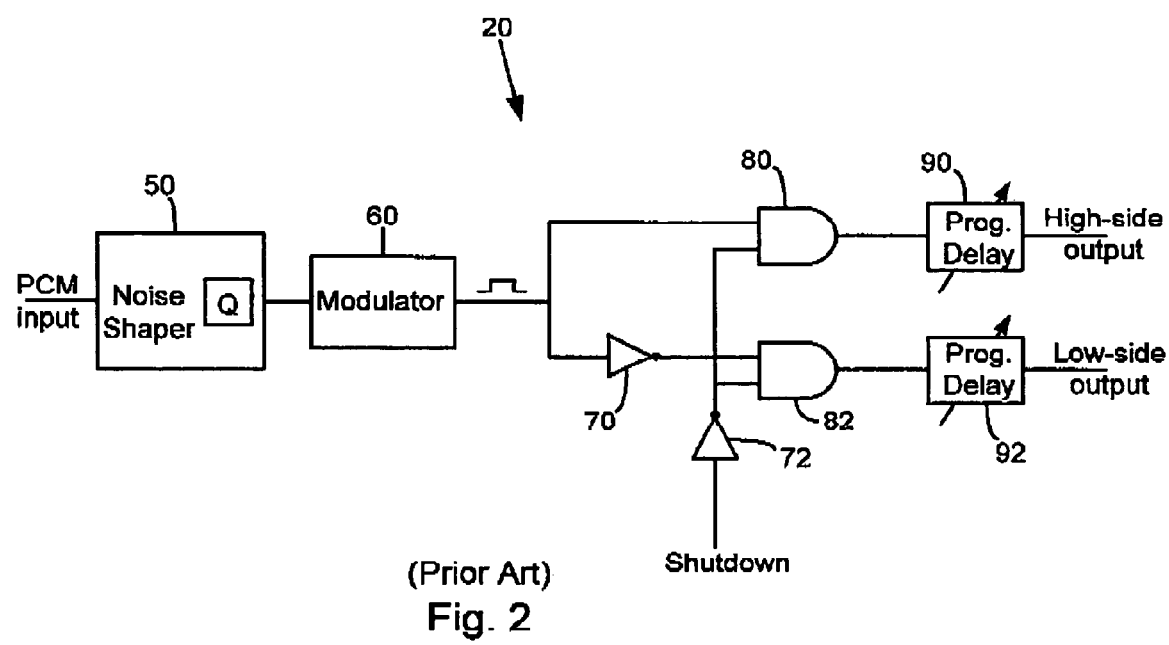
FIG. 2 is a detailed view of the controller circuitry of the system of FIG. 1.

Referring to FIG. 2, a more detailed view of the controller circuitry of the system of FIG. 1 is shown. As depicted in FIG. 1, a typical PWM controller 20 includes two outputs to control two discrete FETs 42, 44 through a driver 30. PCM input data is typically processed and quantized through a noise-shaper 50 and a modulator 60 to generate a sequence of pulse width modulated pulses. The signal is then split up into a high side signal and a low side signal. The high side signal is driven directly, while the low side signal is driven through an inverter 70. Typically, an external shutdown signal is allowed to turn of both output FETs. This is accomplished by implementing two AND gates, 80 and 82. A controller might also enable the adjustment of signal delays on each of the high and low sides by providing tunable delay circuitry, 90 and 92. It may be desirable to adjust these delays in order to adjust the respective positions of the signal edges. This mechanism may be used to control overlap, or dead time, during which both FETs are turned on, or off, respectively.

Figure 3:
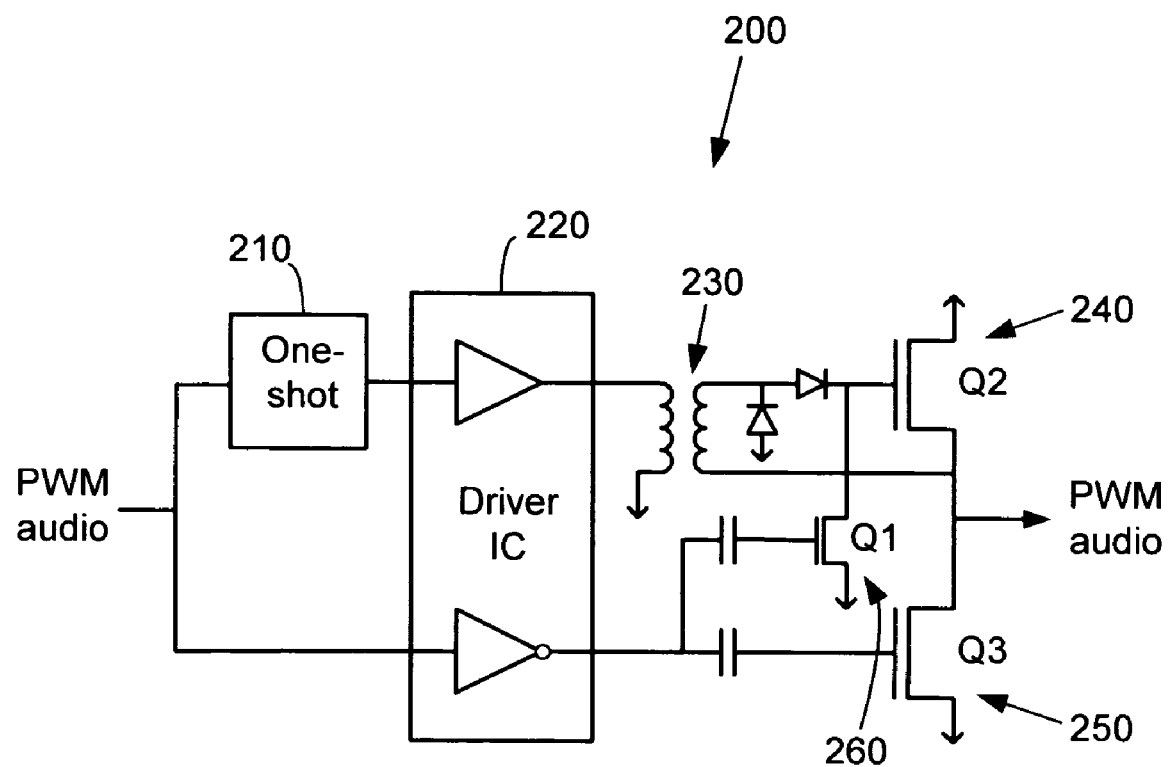
FIG. 3 is a diagram illustrating the components of an alternative PWM output stage in accordance with the prior art.

Referring to FIG. 3, a diagram illustrating the components of an alternative PWM output stage in accordance with the prior art is shown. This output stage uses a pulse transformer to turn on the high-side N-FET, so that a low-voltage driver circuit can be used to drive the FETs.

The circuit consists of a "one-shot" circuit 210, that generates a short pulse when the input PWM signal goes high. The pulse is amplified in one "channel" of low-voltage driver 220 and fed to the primary side of a pulse transformer 230 through a DC blocking capacitor. This generates a pulse on the secondary side of transformer 230, which is transferred through a diode to the gate of the high side N-FET 240. High-side N-FET 240 is then turned on. When one-shot 210 turns off, it generates a negative pulse on the secondary side of pulse transformer 230. This negative pulse is blocked by the diode mentioned above and discharged through a second diode. High-side FET 240 is kept on by the charge on the gate capacitance.

The input to output stage 200 also directly drives the second "channel" on low-voltage driver circuit 220. This signal is inverted by driver circuit 220, so that when the input goes low, the output of the driver goes high. The output of this "channel" of driver circuit 220 passes through a level shifting capacitor_and turns on low-side output N-FET 250. This signal also simultaneously turns on a third N-FET 260. N-FET 260 is coupled to the gate of high side N-FET 240 so that N-FET 240 is turned off when N-FET 250 is turned on.

The output stage illustrated in FIG. 3 provides several advantages over the more traditional system shown in FIG. 1. For example, it allows a low-voltage driver circuit to be used instead of a high-voltage circuit. Low-voltage circuits of this type are widely available at a cost that is much lower than an equivalent high-voltage circuit. Another advantage of the output stage of FIG. 3 is that it incorporates capacitively coupled level shifting. In other words, though voltage level of the driver circuit is decoupled from the voltage level of the FETs.

The output stage of FIG. 1 does, however, have several shortcomings of its own. For instance, it requires more circuitry. As shown in the figure, this output stage requires a pulse transformer, a one-shot integrated circuit (IC) and peripheral components to generate a pulse for the transformer, and a third FET to discharge the gate of the high-side N-FET. Additional miscellaneous capacitors and diodes are also necessary. Another disadvantage of this output stage is that it does not allow both FETs (240 and 250) to be turned off when the output stage is shut down. Still another disadvantage of this output stage is that it has a single input—the signals that driver FETs 240 and 250 cannot be independently controlled. As a result, the signals cannot be delayed, and the respective phases of the signals cannot be shifted relative to each other.

Figure 4:
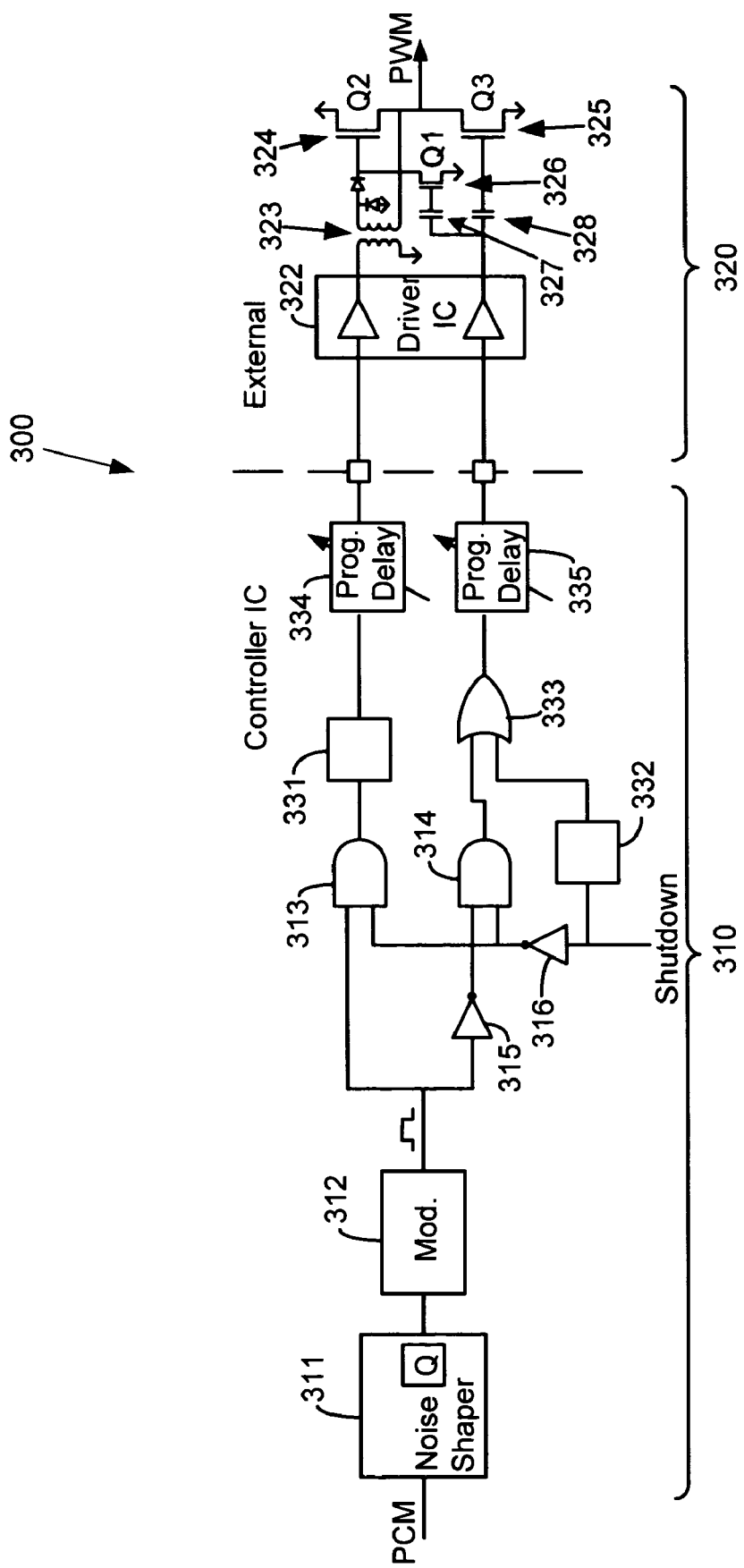
FIG. 4 is a diagram illustrating a channel of an audio amplifier system in accordance with one embodiment of the invention.

Referring to FIG. 4, a diagram illustrating a channel of an audio amplifier system in accordance with one embodiment of the invention is shown. The figure is simplified to only show the major components such as the pulse transformer, level shifting capacitors, FETs and the like. This system incorporates various features that may eliminate one or more of the negative aspects of the prior art systems described above.

The system 300 of FIG. 4 includes a controller circuit 310 and an output stage 320. One of the features incorporated in the system 300 is the use of an output stage 320 that has separate inputs for the high side and low side. The high-side input (which, as explained below, is a pulse) is passed through one "channel" of low-voltage driver 322, which amplifies it and transmitted to the primary side of pulse transformer 323. This generates a corresponding pulse on the secondary side of transformer 323 which is transmitted to the gate of FET 324, turning it on.

In the embodiments described herein, signals are generally considered to be asserted (or active, or "on") when the signals are high. It should be noted that, in other embodiments, the signals may be asserted when they are low. These use of particular signals that are asserted when high (or low) is considered to be a design choice. Consequently, embodiments in which asserted signals are low instead of high are believed to be within the scope of the invention.

On the low side input of output stage 320, the received low-side signal is passed directly to low-voltage driver 322. The low-side signal is processed by a "channel" that is separate from the one that handles the high-side signal. In this instance, driver 322 is of the non-inverting type. Driver 322 amplifies this signal and passes it through level shifting capacitors 327 and 328 to the gates of FETs 325 and 326.

When the low-side signal goes high, FET 325 is turned on and FET 324 is turned off (by FET 326, which is also turned on).

Output stage 320 provides the advantages of enabling the use of a low voltage driver circuit 322 and allowing level shifting through the use of capacitors 327 and 328. While output stage 320 is similar to the output stage illustrated in FIG. 3, it should be noted that the prior art output stage of FIG. 3 has only a single input and requires that the low-side signal be inverted so that it can be used to drive the low-side FETs. Because output stage 320 accepts separate high-side and low-side signals, the signals can be manipulated with respect to each other (e.g. their relative phases can be shifted, or both high-side and low-side FETs can be turned off) to improve the functionality of the system.

Controller circuit 310 includes a noise shaper 311 and pulse width modulator 312 which shape a received PCM audio signal and modulate it to produce a pulse width modulated signal. This pulse width modulated signal is split and forwarded to AND gates 313 and 314. The high-side signal received by AND gate 313 is not inverted, while the low-side signal received by AND gate 314 is inverted by inverter 315. A shutdown signal is also fed to each of AND gates 313 and 314 through inverter 316.

On the high side, the output of AND gate 313 is forwarded to a pulse shortening unit 331. The pulse shortening unit 331 eliminates the need for an external one-shot in the output stage. The operation of the pulse shorteners is explained below with reference to FIGS. 5 and 6. A programmable delay is added to the signal by delay unit 334 before the signal is produced at the high-side output of controller 310 (from which it is passed to the high-side input of output stage 320).

On the low side of controller circuit 310, the output of AND gate 314 is used as an input to OR gate 333. A second input to OR gate 333 is generated by passing the shutdown signal through a second pulse shortening unit 332 and providing the resulting output to OR gate 333. Similar to the high side of controller 310, a programmable delay is added to the low-side signal by delay unit 335 before it is produced at the low-side output of the controller. From the low-side controller output, the signal is passed to the low-side input of output stage 320.

In the case of the low side of controller 310, the output of pulse shortener 332 is low as long as the shutdown signal is not asserted (i.e., it is low). If the shutdown signal is not asserted, this input to OR gate 333 is zero, and the signal output by AND gate 314 is simply passed through OR gate 333 to delay unit 335. If the shutdown signal is asserted, a pulse is generated on the low side of the controller and the transistors are shut down.

The purpose of pulse shortener 332 is to ensure that the charge is drained off the gate of high-side transistor 324 when the system is shut down. This is necessary because transistor 324 is turned on by a pulse from the secondary side of transformer 323 and remains on until transistor 326 is turned on. When transistor 326 is turned on, transistor 324 is turned off. (Transistor 325 is turned on at the same time as transistor 326.)

Thus, in the absence of pulse shortener 332 and OR gate 333, assertion of the shutdown signal while high-side transistor 324 is turned on will shut down the high-side and low-side signals and will turn off low-side transistor 325, but will leave high-side transistor 324 turned on (because of the charge on its gate). If, on the other hand, low-side transistor 325 is turned on when the shutdown signal is asserted, both transistors will shut down. By using pulse shortener 332 and OR gate 333, a short pulse is generated on the low side, thereby turning on transistors 325 and 326. When transistor 326 is turned on, it drains the charge from the gate of transistor 324 and turns it off. After the pulse passes, transistors 325 and 326 will turn off as well.

Figure 5:
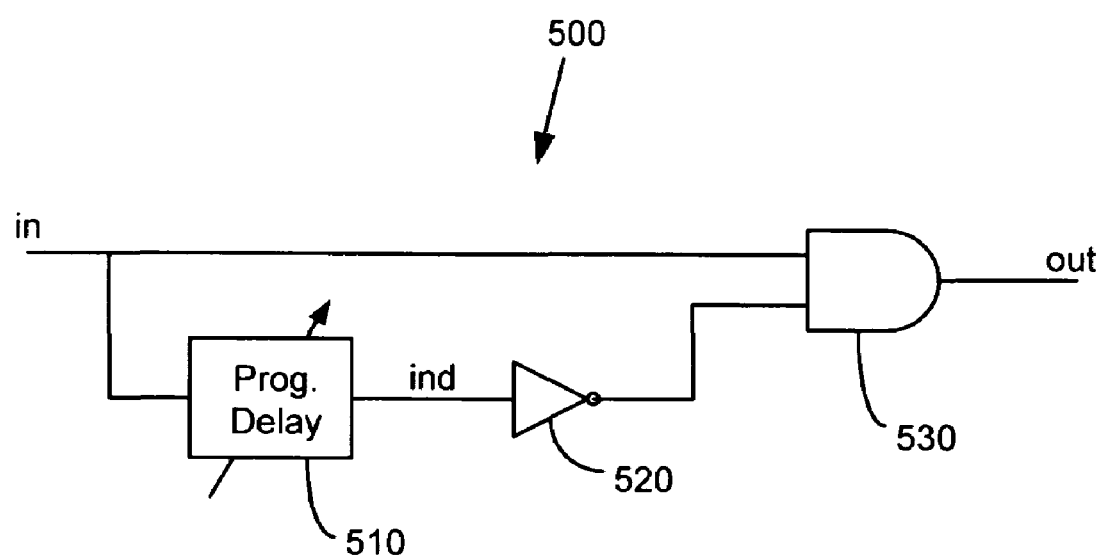
FIG. 5 is the structure of a pulse shortener in accordance with one embodiment.

Referring to FIG. 5, the structure of a pulse shortener in accordance with one embodiment is shown. In this embodiment, pulse shortener 500 comprises a programmable delay unit 510, an inverting amplifier 520 and an AND gate 530. An input signal to pulse shortener 500 is received and transmitted to both programmable delay unit 510 and AND gate 530. In one embodiment, programmable delay unit 510 is digitally programmable. The signal is delayed by a predetermined period and is then forwarded to inverting amplifier 520. The purpose of inverting amplifier 520 is simply to invert the signal. The output of inverting amplifier 520 is then also input to AND gate 530. The output of AND gate 530 is the output of pulse shortener 500. The programmable delay used in the pulse shortener does not need individually programmable rise and fall delays.

Figure 6:
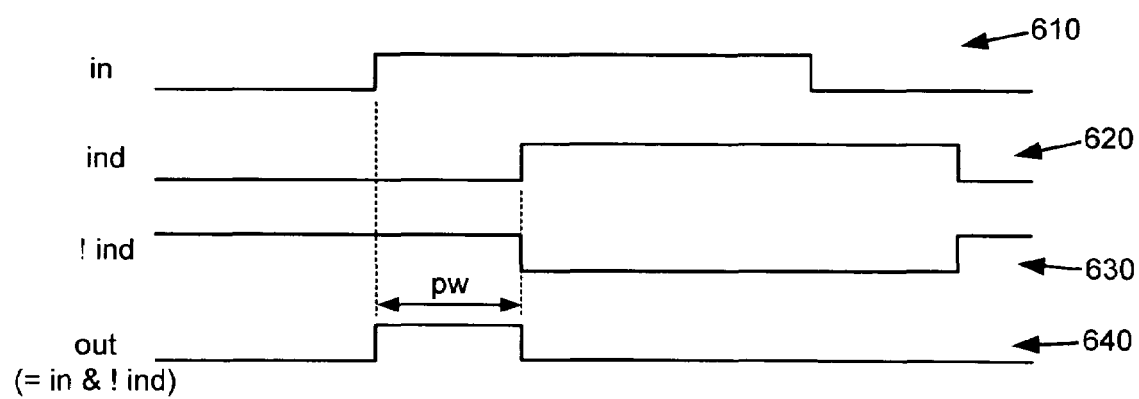
FIG. 6 is a timing diagram illustrating the signals at different points in the diagram of FIG. 5.

Referring to FIG. 6, a timing diagram illustrating the different signals described above with reference to FIG. 5 is shown. The first signal 610 shown in FIG. 6 is the input to pulse shortener 500. Signal 610 makes a simple transition from low to high. The next signal 620 is the output of programmable delay unit 510. Signal 620 is a delayed version of input signal 610. The delay, pw, is determined by programmable delay unit 510. Delay pw will be the width of the pulse output by pulse shortener 500. The next signal 630 is signal 620, inverted. Signals 610 and 630 are input to AND gate 530. The signal produced by AND gate 530 is the last signal 640 shown in FIG. 6. This signal is a single pulse having a rising edge synchronized with input signal 610 and a width, pw, set by programmable delay unit 510.

Referring again to FIG. 4, it should be noted that programmable delay units 334 and 335 are, in this embodiment, implemented as digitally programmable units which are integrated into the controller chip. Prior art delay units were actually circuits that had to be adjusted at the design or test stages. Once the design was finalized and the system manufactured, the delay became fixed. In the present systems and methods, the delay continues to be programmable after manufacture. It is only necessary to modify the value in the chip that controls the delay.

Because the programmable delay units can be adjusted separately for both the high side and the low side of the controller, the relative phases of the high-side and low-side signals can be adjusted. It is therefore possible to optimize, for example, the overlap of the signals and to thereby control the amount of dead time between high-side and low-side pulses, or the amount of shoot-through current that results from overlap of the pulses.

The various embodiments of the present invention may incorporate different combinations of the features described above. Thus, one embodiment may include an output stage that has separate high-side and low-side inputs to a transformer-coupled high-side transistor and a capacitively coupled low-side transistor. Another embodiment may include components for generating a short pulse of the low-side signal to drain the charge from the high-side transistor's gate prior to shutdown. Yet another embodiment may include digitally programmable delay units or altering the relative phases of the high-side and low-side signals. Still other embodiments may incorporate various combinations of these features.

It should be noted that in one alternative environment, the pulse shortener for the high-side signal (item 331 in FIG. 4) may be eliminated in favor of a one-shot circuit in the output stage. In such an embodiment, the one-shot circuit would generate the pulse to drive the high-side transistor. In another alternative embodiment, it might not be necessary to have the pulse shortener or the one-shot, as it may be desirable to provide signal outputs from the controller that use simple pulse width modulation, rather than converting the PWM pulses to short, turn-on pulses. This might enable the controller to be used with different types of output stages.

The various embodiments of the invention may provide a number of advantages over the prior art. For example, they may enable the use of a low-voltage, low-cost driver circuit instead of a high-voltage circuit to drive the high-voltage transistors in the output stage. Various embodiments may also enable level shifting between the controller and the output stage. Further, various embodiments may enable both high-side and low-side transistors in the output stage to be turned off at shutdown.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system comprising:
   a pulse width modulation (PWM) controller,
      wherein the PWM controller provides a first output for a high-side PWM signal and a second output for a low-side PWM signal; and
   output stage,
      wherein the output stage is configured to receive the high-side signal from the first PWM controller output and the low-side signal from the second PWM controller output, and
   wherein the high-side signal is coupled to a high-side transistor through a pulse transformer
   wherein the output stage further comprises a third transistor, wherein the third transistor is coupled to receive the low-side signal and wherein the third transistor is configured to turn off the high-side transistor when the low-side signal is asserted.

2. The system of claim 1, wherein the low-side signal is coupled to the third transistor through one or more level shifting capacitors.

3. The system of claim 1, wherein the PWM controller is configured to provide a pulse at the second PWM controller output upon shutdown of the transistors.

4. The system of claim 1, wherein the low-side signal is coupled to a low-side transistor through one or more level shifting capacitors.

5. The system of claim 1, further comprising a high-side programmable delay unit configured to delay the high-side signal by a first programmable amount and a low side programmable delay unit configured to delay the low-side signal by a second programmable amount.

6. The system of claim 1, wherein the PWM controller is configured to produce a pulse as the high-side signal at the first PWM controller output.

7. The system of claim 5, wherein the high-side programmable delay unit and the low-side programmable delay unit are integrated into the PWM controller.

8. The system of claim 5, wherein the high-side programmable delay unit is digitally programmable to adjust the first programmable amount and the low-side programmable delay unit is digitally programmable to adjust the second programmable amount.

9. The system of claim 5, wherein the PWM controller is configured to adjust overlap of pulses of the high-side signal and the low-side signal by adjusting at least one of the first and second programmable amounts.

10. The system of claim 6, wherein the output stage further comprises a low-voltage driver, and wherein the low-voltage driver amplifies the pulse and transmits the amplified pulse to the pulse transformer.

11. An output stage for a PWM amplifier comprising:
    a first input for a high-side PWM signal and a second input for a low-side PWM signal;
    a first transistor coupled to receive the high-side PWM signal and a second transistor coupled to receive the low-side PWM signal;
    a pulse transformer coupled between the first input and the first transistor; and
    a third transistor coupled between the second input and the first transistor;
    wherein when a pulse is received at the first input, the first transistor is turned on, and when a pulse is received at the second input, the second transistor is turned on and the first transistor is turned off.

12. The system of claim 11, wherein the low-ide signal is coupled to the third transistor through one or more level shifting capacitors.

13. The system of claim 11, wherein the PWM controller is configured to provide a pulse at the second PWM controller output upon shutdown of the transistors.

14. The system of claim 11, further comprising one or more level shifting capacitors coupled between the second input and the second and third transistors.

* * * * *